United States Patent
Bai et al.

(10) Patent No.: US 12,294,036 B2
(45) Date of Patent: May 6, 2025

(54) METHOD FOR MANUFACTURING MONOCRYSTALLINE SILICON WAFER CONTAINING ARCED SIDE, METHOD FOR MANUFACTURING MONOCRYSTALLINE SILICON CELL, AND PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Xiaolong Bai, Jiangxi (CN); Lizhu He, Jiangxi (CN); Xinyu Zhang, Jiangxi (CN); Peiyuan Wang, Jiangxi (CN); Jun Yang, Jiangxi (CN); Ziyang Ou, Jiangxi (CN); Jide Huang, Jiangxi (CN); Weize Shang, Jiangxi (CN); Hao Jin, Jiangxi (CN)

(73) Assignees: JINKO SOLAR CO., LTD., Jiangxi (CN); ZHEJIANG JINKO SOLAR CO., LTD., Zhejiang (CN)

( * ) Notice: Subject to any disclaimer, the term of this patent is extended or adjusted under 35 U.S.C. 154(b) by 16 days.

(21) Appl. No.: 18/222,377

(22) Filed: Jul. 14, 2023

(65) Prior Publication Data
US 2023/0361238 A1 Nov. 9, 2023

Related U.S. Application Data

(63) Continuation of application No. 17/039,425, filed on Sep. 30, 2020, now Pat. No. 11,742,453.

(30) Foreign Application Priority Data

Dec. 11, 2019 (CN) .......................... 201911268035.2

(51) Int. Cl.
*H01L 31/18* (2006.01)
*B23K 26/364* (2014.01)
(Continued)

(52) U.S. Cl.
CPC .......... *H01L 31/186* (2013.01); *B23K 26/364* (2015.10); *B23K 26/40* (2013.01);
(Continued)

(58) Field of Classification Search
CPC ........... H01L 31/186; H01L 31/035281; H01L 31/042; H01L 31/1804; B23K 26/364;
(Continued)

(56) References Cited

U.S. PATENT DOCUMENTS 9,242,333 B2 * 1/2016 Hicks ...................... C01B 33/02
2013/0305528 A1 11/2013 Anderson

FOREIGN PATENT DOCUMENTS

CN 202167499 U 3/2012
CN 103000711 A 3/2013
(Continued)

OTHER PUBLICATIONS

Australian Examination Report issued on Feb. 26, 2021 for Australian Application No. AUS2020244430.
(Continued)

*Primary Examiner* — John P. Dulka
(74) *Attorney, Agent, or Firm* — Knobbe, Martens, Olson & Bear, LLP

(57) ABSTRACT

A method for manufacturing a solar cell, a method for manufacturing a monocrystalline silicon wafer and a photovoltaic module. The method for manufacturing a monocrystalline silicon wafer includes: providing a monocrystalline silicon rod; squaring the monocrystalline silicon rod to form a quasi-square silicon rod with quasi-square cross-section having an arc, a length of the arc being not less than 15 mm; slicing the quasi-square silicon rod to form at least one quasi-square silicon wafer having the arc. The method for manufacturing at least one solar cell includes: using the method described above to obtain a quasi-square silicon
(Continued)

wafer having an arc; forming a first solar cell by processing the quasi-square silicon wafer; scribing the first solar cell to obtain a square-shaped sub-solar cell and at least one strip-shaped sub-solar cell. The above methods improve the utilization rate of the monocrystalline silicon rod and reduce production cost.

19 Claims, 7 Drawing Sheets

(51) Int. Cl.
 B23K 26/40 (2014.01)
 B23K 101/40 (2006.01)
 B28D 5/04 (2006.01)
 H01L 31/0352 (2006.01)
 H01L 31/042 (2014.01)

(52) U.S. Cl.
 CPC ........ *B28D 5/04* (2013.01); *H01L 31/035281* (2013.01); *H01L 31/042* (2013.01); *B23K 2101/40* (2018.08)

(58) Field of Classification Search
 CPC .... B23K 26/40; B23K 2101/40; B23K 26/38; B28D 5/04; B28D 5/00; Y02E 10/547; Y02P 70/50
 See application file for complete search history.

(56) References Cited

FOREIGN PATENT DOCUMENTS

| | | | |
|---|---|---|---|
| CN | 108582527 A | 9/2018 | |
| CN | 109747055 A * | 5/2019 | ............... B28D 5/00 |
| CN | 109873051 A | 6/2019 | |
| CN | 109968136 A | 7/2019 | |
| EP | 2610918 A1 | 7/2013 | |
| WO | WO 2015/085642 A1 | 6/2015 | |

OTHER PUBLICATIONS

Chinese Office Action issued on Jan. 11, 2021 for Chinese Application No. CN201911268035.2.
Examination Report for European Application No. 20198972.0, dated Jun. 27, 2022, in 5 pages.
International Search Report issued on Nov. 18, 2020 for International Application No. 20198972.0.

* cited by examiner

METHOD FOR MANUFACTURING MONOCRYSTALLINE SILICON WAFER CONTAINING ARCED SIDE, METHOD FOR MANUFACTURING MONOCRYSTALLINE SILICON CELL, AND PHOTOVOLTAIC MODULE

CROSS-REFERENCE TO RELATED APPLICATIONS

The present application is a continuation of U.S. patent application Ser. No. 17/039,425 (now U.S. Pat. No. 11,742, 453), filed on Sep. 30, 2020, which claims priority to Chinese Patent Application No. 201911268035.2, filed on Dec. 11, 2019, the contents of which are incorporated herein by reference in their entireties.

TECHNICAL FIELD

The present disclosure relates to the technical field of photovoltaic manufacture and, in particular, to methods for manufacturing at least one solar cell, a monocrystalline silicon wafer therein, and a photovoltaic module.

BACKGROUND

Photovoltaic related companies desire to reduce manufacture costs through the improvement of module efficiency and power generation capacity, thus the monocrystalline silicon solar cell is selected as a mainstream technique. Besides, the tendency of larger size and thinner thickness of a silicon wafer is necessary, thereby BOS (balancing of system) cost can be reduced as well.

With the development of solar cell technology, the size of the silicon wafer has become larger and larger, a diameter of a monocrystalline silicon rod has also gradually increased, and there are more and more monocrystalline offcut materials cut by a squaring process of the monocrystalline silicon rod, such that the utilization rate of the silicon rod becomes lower and lower, thus making production cost from crystal to silicon wafer become higher and higher.

SUMMARY

In order to solve the above problems, the present disclosure provides a method for manufacturing a monocrystalline cell and a method for manufacturing a monocrystalline silicon wafer, to improve the utilization rate of the monocrystalline silicon rod and reduce production cost of the monocrystalline silicon wafer.

The present disclosure provides a method for manufacturing a monocrystalline cell, the method includes: obtaining a quasi-square silicon wafer having at least one arc, a length of each of the at least one arc being not less than 15 mm; forming the solar cell by processing the quasi-square silicon wafer; and scribing the solar cell to obtain a square-shaped sub-solar cell and at least one strip-shaped sub-solar cell, the number of the at least one strip-shaped sub-solar cell being equal to the number of the at least one arc of the quasi-square.

In an embodiment, the obtaining a quasi-square silicon wafer having at least one arc includes: providing a monocrystalline silicon rod; squaring the monocrystalline silicon rod to obtain a quasi-square silicon rod with a quasi-square cross-section having the at least one arc, the length of each of the at least one arc being not less than 15 mm; and slicing the quasi-square silicon rod to obtain at least one quasi-square silicon wafer having the at least one arc.

In an embodiment, in the above method for manufacturing a monocrystalline silicon wafer, the at least one arc includes four arcs.

In an embodiment, in the above method for manufacturing a monocrystalline silicon wafer, a diameter of the monocrystalline silicon rod ranges from 230 mm to 305 mm.

In an embodiment, in the above method for manufacturing a monocrystalline cell, the cell wafer is cut by a laser scribing technique.

In an embodiment, in the above method for manufacturing a monocrystalline cell, the square-shaped sub-solar cell has a side length of 158.75 mm, and the strip-shaped sub-solar cell has a length of 95 mm and a width of 25 mm.

In an embodiment, in the above method for manufacturing a monocrystalline cell, the square-shaped sub-solar cell has a side length of 182 mm, and the strip-shaped sub-solar cell has a length of 125 mm and a width of 20 mm.

In an embodiment, in the above method for manufacturing a monocrystalline cell, the square-shaped sub-solar cell has a side length of 210 mm, and the strip-shaped sub-solar cell has a length of 158.75 mm and a width of 20 mm.

In an embodiment, in the above method for manufacturing a monocrystalline cell, the square-shaped sub-solar cell has a side length of 182 mm, and the strip-shaped sub-solar cell has a length of 140 mm and a width of 23 mm.

The present disclosure further provides a photovoltaic module, including at least one solar cell string including a plurality of sub-solar cells, wherein the plurality of sub-solar cells are formed from a plurality of solar cells, and each of the plurality of solar cells is manufactured using a quasi-square silicon wafer having at least one arc, a length of each of the at least one arc being not less than 15 mm.

In an embodiment, each of the plurality of solar cells is scribed to obtain a square-shaped sub-solar cell and at least one strip-shaped sub-solar cell, the number of the at least one strip-shaped sub-solar cell being equal to the number of the at least one arc of the quasi-square silicon wafer.

In an embodiment, the least one solar cell string include a first solar cell string includes composed of a plurality of the square-shaped sub-solar cells arranged along a first direction to form a first solar cell string; and the photovoltaic module includes a plurality of the first solar cell strings arranged along a second direction.

In an embodiment, the least one solar cell string include a second solar cell string composed of the solar cell includes a plurality of strip-shaped sub-solar cells arranged along a first direction to form a second solar cell string; and the photovoltaic module includes a plurality of the second solar cell strings arranged along a second direction.

In an embodiment, the least one solar cell string include a first solar cell string composed of the square-shaped sub-solar cells arranged along a first direction and a second solar cell string composed of the strip-shaped sub-solar cells arranged along the first direction; and the photovoltaic module includes a plurality of the first solar cell strings arranged along a second direction and at least one second solar cell string arranged at an edge of the plurality of first solar cell strings or interposed between adjacent two of the plurality of first solar cell strings.

In an embodiment, the square-shaped sub-solar cell has a side length of 182 mm, and the strip-shaped sub-solar cell has a length of 140 mm and a width of 23 mm; and the photovoltaic module includes five first solar cell strings and one second solar cell string.

In an embodiment, the square-shaped sub-solar cell has a side length of 182 mm, and each of the at least one strip-shaped sub-solar cells has a length of 125 mm and a width of 20 mm.

In an embodiment, the square-shaped sub-solar cell has a side length of 210 mm, and each of the at least one strip-shaped sub-solar cells has a length of 158.75 mm and a width of 20 mm.

In an embodiment, each of the plurality of solar cells is scribed to obtain four strip-shaped sub-solar cells.

In an embodiment, each of the plurality of solar cells is scribed by a laser scribing technique.

In an embodiment, the square-shaped sub-solar cell has a side length of 158.75 mm, and the strip-shaped sub-solar cell has a length of 95 mm and a width of 25 mm.

It can be seen from the above description that, as for the method for manufacturing a monocrystalline silicon wafer provided in the present disclosure, since it includes providing a monocrystalline silicon rod first, then squaring the monocrystalline silicon rod to obtain a quasi-square silicon rod with a quasi-square section having an arc, the length of the arc is not less than 15 mm, and finally slicing the quasi-square silicon rod to obtain at least one quasi-square silicon wafer having the arc, and in the method for manufacturing a monocrystalline cell provided in the present disclosure, since it uses the quasi-square silicon wafer with an arc manufactured above, then fabricating the silicon wafer into a cell wafer and finally scribing the cell wafer to obtain one square-shaped sub-solar cell and at least one strip-shaped sub-solar cell, compared with the solution in the related art where only one square-shaped sub-solar cell can be scribed, at least one strip-shaped sub-solar cell can be additionally obtained, and it can be applied to shingled or spliced assemblies, which reduces the waste of silicon materials, thereby improving the utilization rate of the monocrystalline silicon rod and reducing the production cost of monocrystalline silicon wafers.

BRIEF DESCRIPTION OF DRAWINGS

In order to more clearly illustrate the embodiments of the present disclosure or the technical solutions in the related art, the accompany drawings used in the description of the embodiments or the related art will be briefly introduced below. It is appreciated that, the accompany drawings in the following description are only embodiments of the present disclosure, and other drawings can be obtained by those of ordinary skill in the art from the provided drawings without creative work.

DESCRIPTION OF EMBODIMENTS

The core concept of the present disclosure is to provide a method for manufacturing at least one solar cell and a monocrystalline silicon wafer, which can improve the utilization rate of a monocrystalline silicon rod and reduce production cost of the monocrystalline silicon wafer.

The technical solutions in the embodiments of the present disclosure will be clearly and completely described below in conjunction with the accompanying drawings in the embodiments of the present disclosure. It is appreciated that, the described embodiments are only a part of the embodiments of the present disclosure but not all of them. Based on the embodiments of the present disclosure, all other embodiments obtained by those of ordinary skill in the art without creative work shall fall within the protection scope of the present disclosure.

Figure 1:
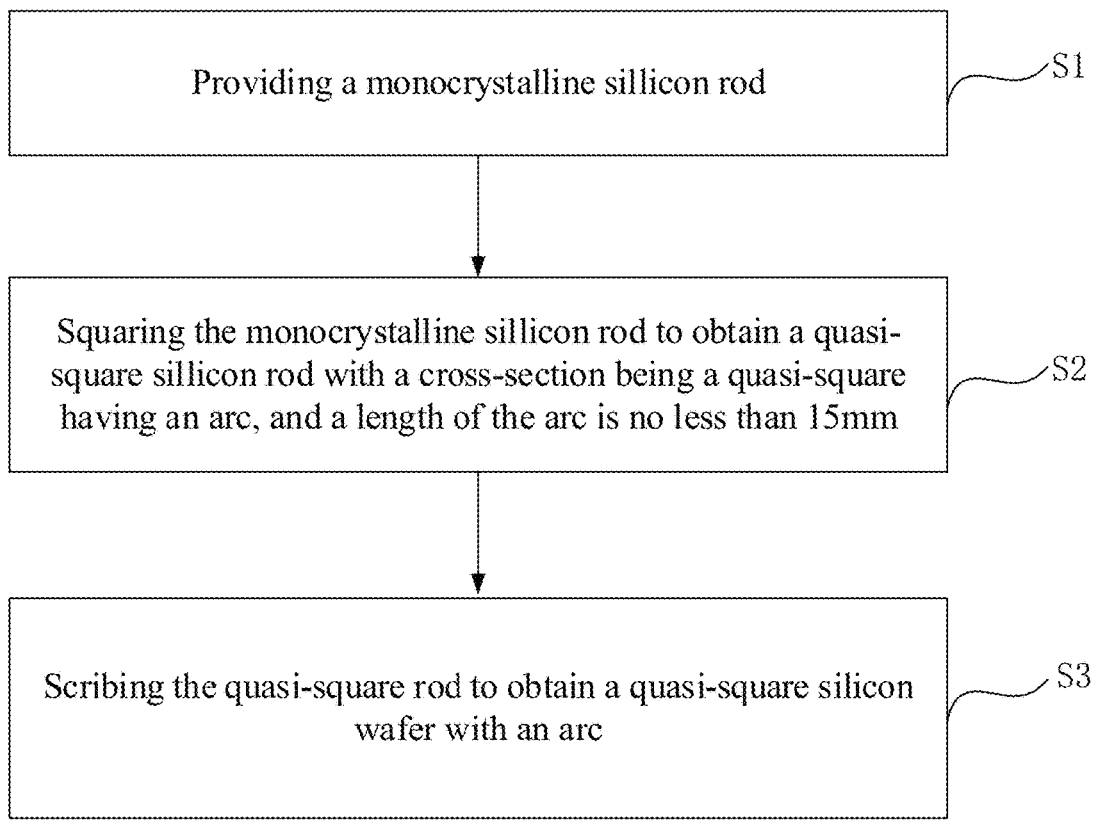
FIG. 1 is a schematic diagram of a method for manufacturing a monocrystalline silicon wafer according to some embodiments of the present disclosure.

FIG. 1 is a flowchart illustrating an exemplary process for manufacturing a monocrystalline silicon wafer according to some embodiments of the present disclosure, including the following steps:

S1: providing a monocrystalline silicon rod;

In some embodiments, the monocrystalline silicon rod may be prepared by a Czochralski (Cz) process and/or a floating zone (Fz) process.

Figure 2:
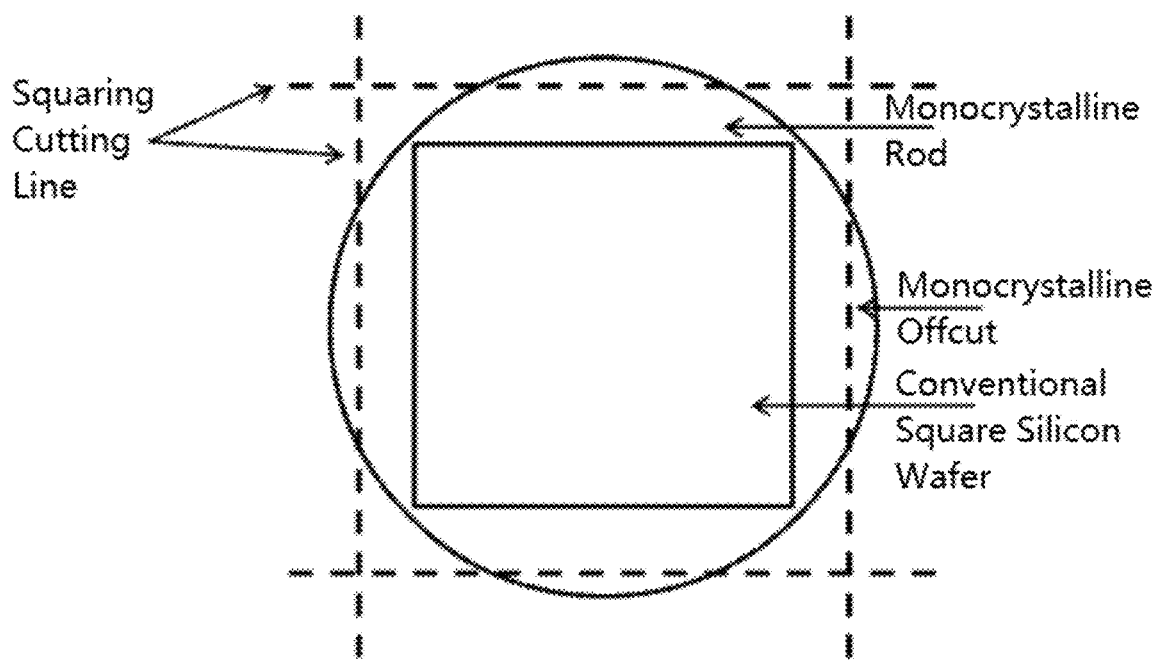
FIG. 2 is a schematic diagram of using the method according to some embodiments of the present disclosure to square a monocrystalline silicon rod.
Figure 3:
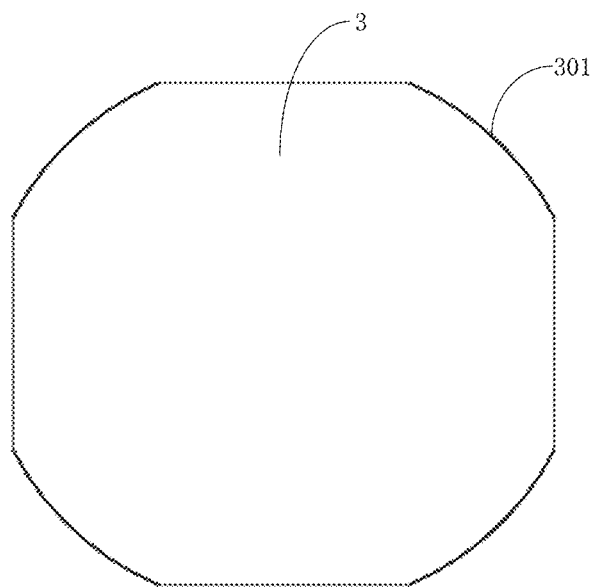
FIG. 3 is a schematic diagram of a quasi-square silicon rod squared by using the method provided in the present disclosure.

S2: squaring the monocrystalline silicon rod, to obtain a quasi-square silicon rod with a cross-section being a quasi-square having an arc, and a length of the arc is not less than 15 mm;

Referring to FIG. 2, FIG. 2 is a schematic diagram of squaring the monocrystalline silicon rod according to some embodiments of the present disclosure. A circular outline in FIG. 2 is an outline of the monocrystalline silicon rod, while a square outline in the interior thereof is a conventional squaring position where only a conventional square silicon block is obtained, and surrounding silicon materials are all wasted. However, four dashed lines in FIG. 2 indicate a squaring position adopted by the method provided in the present disclosure, and an alternative solution is that a side length of the dashed lines of the squaring equals to a side length of the conventional internal square silicon block outline pluses a width of a long silicon block pluses 1.5 mm to 2.5 mm, it can be seen that the squaring position provided in the present disclosure has moved a certain distance outwards on the basis of the existing method, so that the monocrystalline offcut removed is much less than the conventional squaring method, and the quasi-square silicon rod obtained by this method is as shown in FIG. 3. FIG. 3 is a schematic diagram of a quasi-square silicon rod obtained through squaring by using the method provided in the present disclosure, and it can be seen that the quasi-square silicon rod 3 has arcs 301 and a length of the arc 301 is not less than 15 mm. FIG. 3 schematically shows four arcs 301, but in fact it is not limited to four, which is not limited herein. The arc of this length is longer than that in the related art, so it can be ensured that the long silicon wafer can be finally cut out from an edge position, and waste of the offcut of the silicon material is reduced.

S3: slicing the quasi-square silicon rod, to obtain at least one quasi-square silicon wafer with an arc.

It should be noted that after the slicing process, the obtained quasi-square silicon wafer with the above-mentioned arc becomes a finished product, and it can be made into a cell through a cell manufacturing process.

According to the above description, in the method for manufacturing the monocrystalline silicon wafer provided in the present disclosure, since it includes providing a monocrystalline silicon rod first, then squaring the monocrystalline silicon rod to obtain a quasi-square silicon rod with a quasi-square cross-section having an arc, the length of the arc is not less than 15 mm, and finally slicing the quasi-square silicon rod to obtain at least one quasi-square silicon wafer with arcs, then the quasi-square silicon wafer is made into a solar cell and finally the solar cell is scribed to obtain one square-shaped sub-solar cell and at least one strip-shaped sub-solar cell. Compared with the solution in the related art where only one square-shaped sub-solar cell can be scribed, at least one strip-shaped sub-solar cell can be additionally obtained by the present disclosure. The strip-shaped sub-solar cell can be applied to shingled or spliced assemblies, which reduces the waste of silicon materials, thereby improving the utilization rate of the monocrystalline silicon rod and reducing the production cost of monocrystalline silicon wafers.

In a specific embodiment of the method for manufacturing the monocrystalline silicon wafer, the number of the arcs can be four. In this case, one long strip-shaped cell can be respectively obtained at positions of the four edges, so as to maximize the resource utilization and better avoid the waste of the offcut of the silicon material. Different numbers of arcs can be set according to diameters of actual monocrystalline silicon rods. Here, long strip-shaped silicon blocks having different widths can be obtained according to the diameters of different monocrystalline silicon rods. In some embodiments, a diameter of a monocrystalline silicon rod ranges from 230 mm to 305 mm.

The above method will be described with five examples below. These examples all have four arcs, that is, four long strip-shaped silicon rods can be obtained at the same time respectively for these examples.

(1) When the diameter of the monocrystalline silicon rod is 255.42 mm, the length of an opposite side of the obtained intermediate square rod is 224.75 mm, the final square silicon wafer has the side length of 158.75 mm, the strip-shaped silicon wafer has a length of 125 mm and a width of 32 mm, and the material utilization rate is 77.6%;

(2) When the diameter of the monocrystalline silicon rod is 261.77 mm, the length of the opposite side of the obtained intermediate square rod is 232 mm, the final square silicon wafer has a side length of 166 mm, the long strip-shaped silicon wafer has a length of 125 mm and a width of 32 mm, and the material utilization rate is 79.0%;

(3) When the diameter of the monocrystalline silicon rod is 265.29 mm, the length of the opposite side of the obtained intermediate square rod is 236 mm, the final square silicon wafer has a side length of 170 mm, the long strip-shaped silicon wafer has a length of 125 mm and a width of 32 mm, and the material utilization rate is 78.4%;

(4) When the diameter of the monocrystalline silicon rod is 301.17 mm, the length of the opposite side of the obtained intermediate square rod is 276 mm, the final square silicon wafer has a side length of 210 mm, the long strip-shaped silicon wafer has a length of 125 mm and a width of 32 mm, and the material utilization rate is 82.3%; and (5) When the diameter of the monocrystalline silicon rod is 305 mm, the length of the opposite side of the obtained intermediate square rod is 262 mm, the final square silicon wafer has a side length of 210 mm, the long strip-shaped silicon wafer has a length of 158.75 mm and a width of 25 mm, and the material utilization rate is 82.1%.

Figure 4:
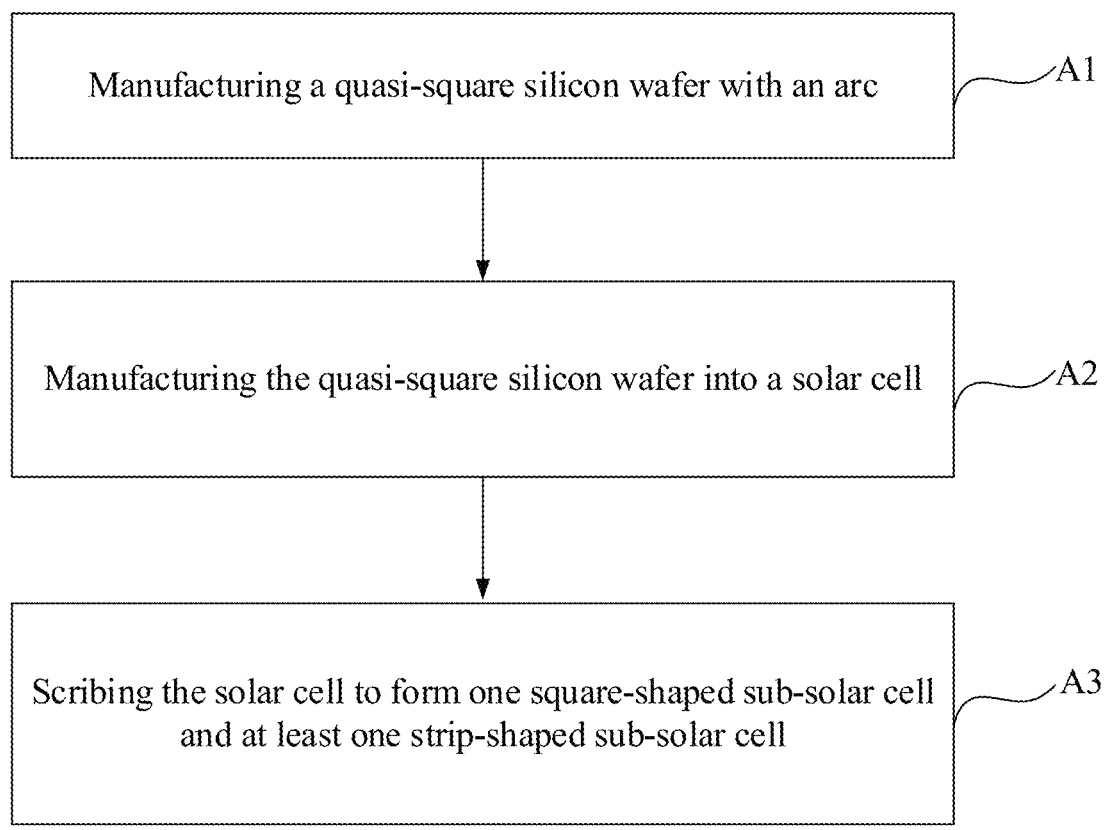
FIG. 4 is a schematic diagram of a method for manufacturing at least one solar cell according to some embodiments of the present disclosure.

FIG. 4 is a schematic diagram of a method for manufacturing at least one solar cell according to some embodiments of the present disclosure. The method includes following steps:

A1: Manufacturing a quasi-square silicon wafer with an arc, for example, using the method illustrated in FIG. 1 or FIG. 2;

The quasi-square silicon wafer with the arc is larger than a square silicon wafer in the conventional silicon slicing manner illustrated in FIG. 2, and the resource utilization rate of the silicon rod is higher for the quasi-square silicon rod obtained via the method illustrated in FIG. 1 or FIG. 2.

A2: Manufacturing the quasi-square silicon wafer into a solar cell;

The solar cell manufacturing processes can be used to fabricate the silicon wafer into the solar cell. For example, the silicon wafer can be processed to the solar cell via one or more preparation process, such as texturing, dopant diffusing, passivating, metallizing. The solar cell may be a passivated emitter rear cell (PERC), an interdigitated back contact (IBC) cell, a tunnel oxide passivated contact (Topcon) cell, a heterojunction with intrinsic thin-film (HJT) cell, and the like.

A3: Scribing the solar cell to form one square-shaped sub-solar cell and at least one strip-shaped sub-solar cell.

Figure 5:
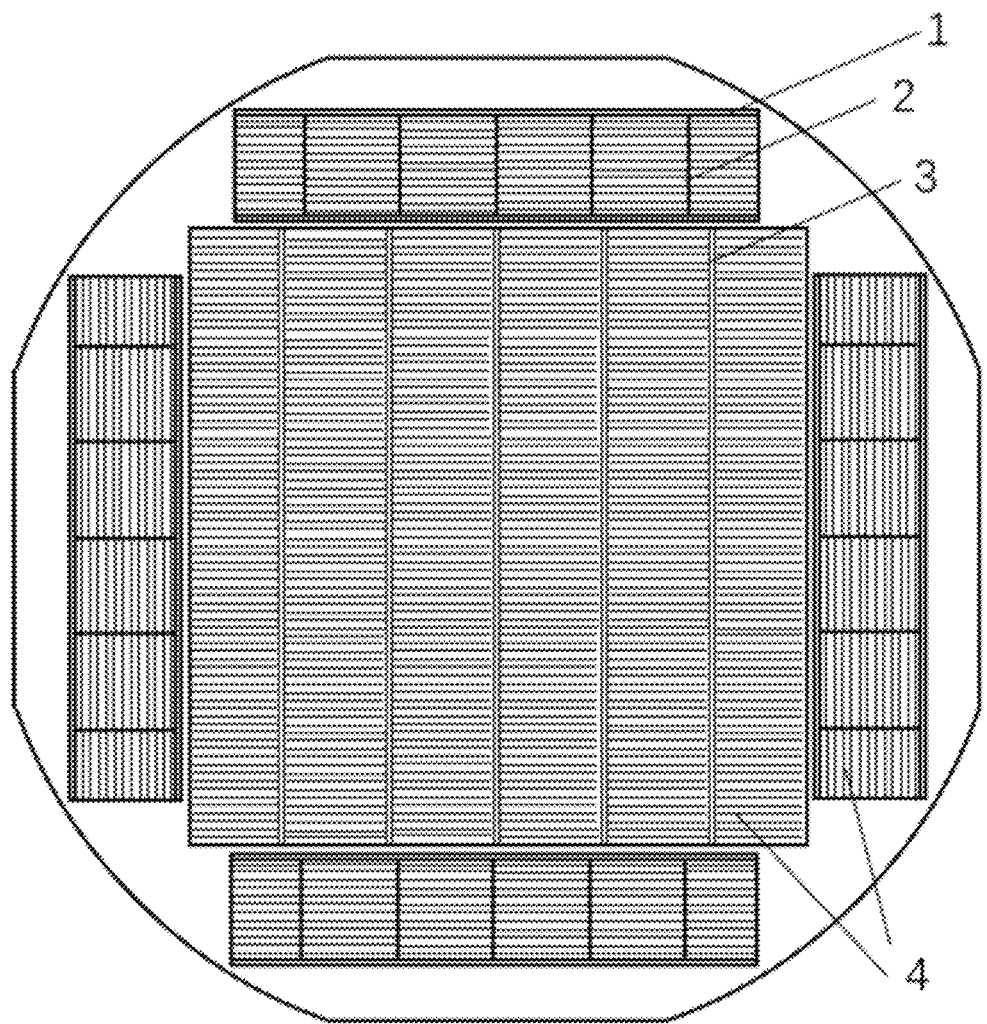
FIG. 5 is a front schematic structural diagram of a printing pattern according to an embodiment of the present disclosure.

For example, the solar cell can be scribed to obtain four strip-shaped sub-solar cells and one squared-shaped sub-solar cell as illustrated in FIG. 5. It should be noted that the number of the stripe-shaped sub-solar cells can be not limited herein, such as one, two, or three.

Figure 6:
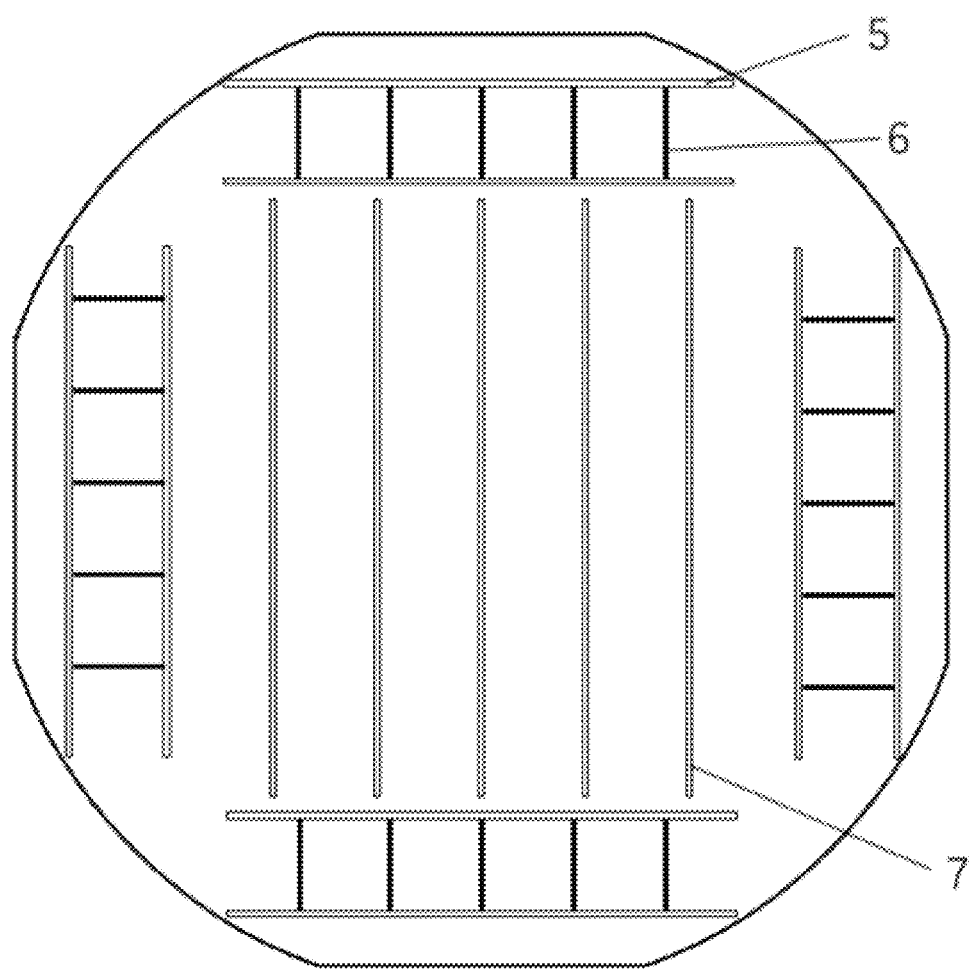
FIG. 6 is rear schematic structural diagram of the printing pattern shown in FIG. 5.

Referring to FIG. 5 and FIG. 6, an embodiment of the present disclosure provides a printing pattern capable of printing the quasi-square silicon wafer into a square-shaped sub-solar cell and at least one strip-shaped sub-solar cell. That is, there is no need to separately print a square silicon wafer and a strip silicon wafer, which simplifies the manufacturing process of the solar cell and improves the production efficiency. As shown in FIG. 5 and FIG. 6, the printing pattern includes a square printing portion and a strip printing portion surrounding the square printing portion. A front side of the square printing portion includes a front main grid 3 and a front auxiliary grid 4, a rear side of the square printing portion includes a rear main grid 7, and the rear main grid 7 corresponds to the front main grid 3. A front side of the strip printing portion includes a front first main grid 1, a front second main grid 2 and a front auxiliary grid 4, a rear side of the strip printing portion includes a rear first main grid 5 and a rear second main grid 6, and the rear first main grid 5 and the rear second main grid 6 correspond to the front first main grid 1 and the front second main grid 2, respectively.

Figure 7:
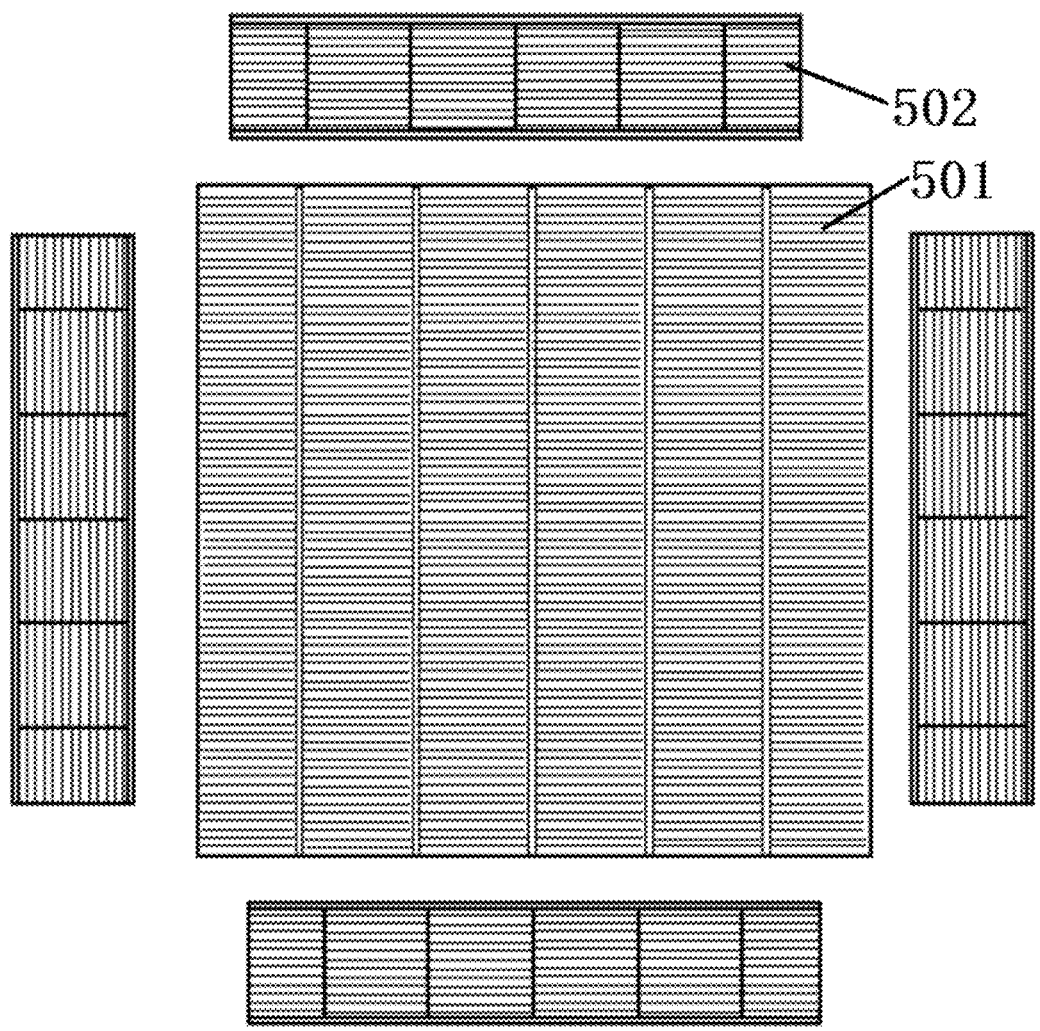
FIG. 7 is a schematic diagram showing a cutting manner for cutting a solar cell formed by the printing pattern shown in FIG. 5 and FIG. 6.

FIG. 7 shows the square-shaped sub-solar cell 501 and the strip-shaped sub-solar cell 502 manufactured by the printing pattern shown in FIG. 5 and FIG. 6. The square-shaped sub-solar cell 501 corresponds to the square printing portion, and the strip printing portion corresponds to the strip-shaped sub-solar cell 502.

Figure 8:
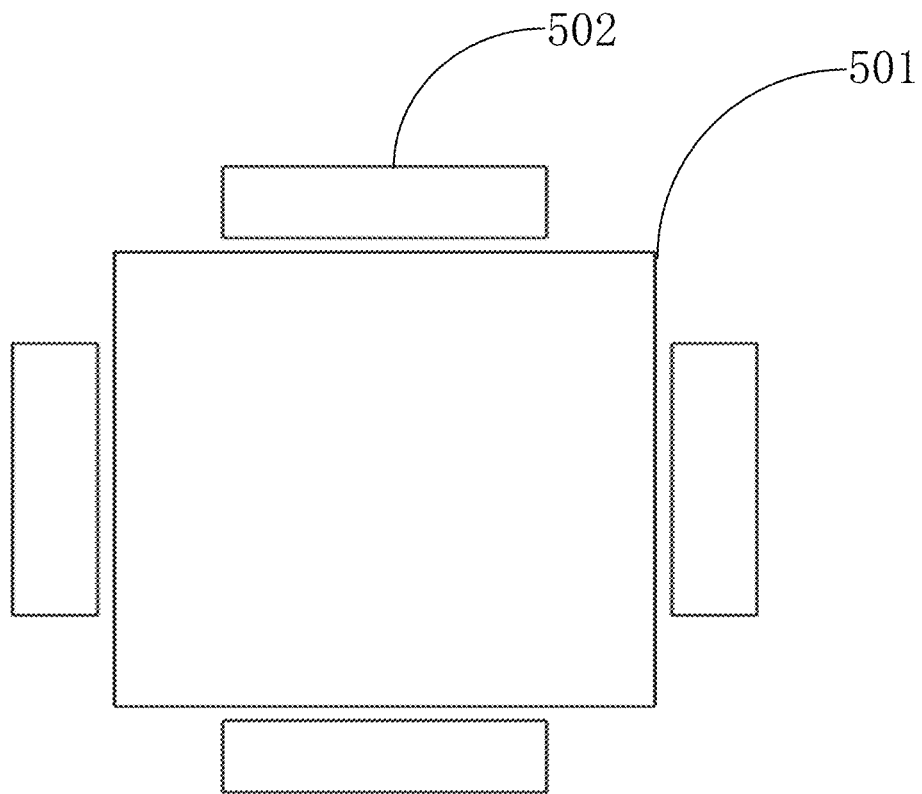
FIG. 8 is a schematic diagram of a square-shaped sub-solar cell and a strip-shaped sub-solar cell obtained after scribing.
Figure 9:
FIG. 9 is a schematic diagram of a cell wafer after scribing.
Figure 9:

FIG. 8 is a schematic diagram of a square-shaped sub-solar cell and a strip-shaped sub-solar cell obtained after scribing. It can be seen that after the scribing, one square-shaped sub-solar cell 501 and four strip-shaped sub-solar cells 502 are obtained. The strip-shaped sub-solar cell 502 can be used in shingle photovoltaic module or splicing photovoltaic module, so as to utilize the silicon materials more efficiently. A wasted silicon wafer after the scribing is shown in FIG. 9, FIG. 9 is a schematic diagram of the cell wafer after the scribing. It can be seen that the amount of the wasted silicon wafer is much smaller than that in methods of the conventional silicon slicing manner, thereby the silicon materials may be saved and the production costs may be reduced.

In some embodiments, a laser scribing may be used to scribe the solar cell, and the laser scribing has higher accuracy and higher efficiency. It is should be noted that various scribing techniques can be used according to actual needs, and not be limited herein.

In some embodiments, if the monocrystalline silicon rod is 230 mm, the side length of the obtained square-shaped sub-solar cell is 158.75 mm, and the strip-shaped sub-solar cell has a length of 95 mm and a width of 25 mm, such that an area of the strip-shaped sub-solar cell that is subsequently scribed out can be maximized, so as to maximize the utilization rate of the monocrystalline silicon rod.

In some embodiments, if the monocrystalline silicon rod is 283 mm, the side length of the obtained square-shaped sub-solar cell is 182 mm, and the strip-shaped sub-solar cell has a length of 125 mm and a width of 20 mm. Such dimensions of the square-shaped sub-solar cell and the striped-shaped sub-solar cell can be manufactured and compatible using existing production line. These square-shaped sub-solar cells and the striped-shaped sub-solar cells can be combined to form the shingled photovoltaic module.

In some embodiments, if the monocrystalline silicon rod is 297 mm, the side length of the obtained square-shaped sub-solar cell is 210 mm, and the strip-shaped sub-solar cell has a length of 158.75 mm and a width of 20 mm. Such dimensions of the square-shaped sub-solar cell and the striped-shaped sub-solar cell can be manufactured and compatible using existing production line. These square-shaped sub-solar cells and the striped-shaped sub-solar cells can be combined to form the shingled photovoltaic module.

Figure 10:
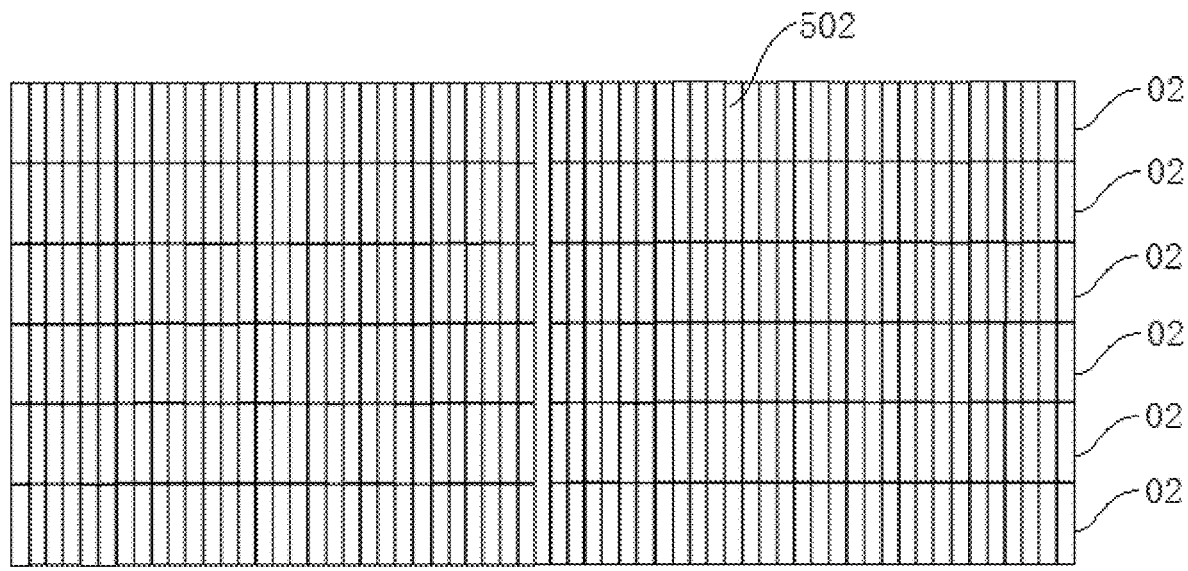
FIG. 10 is a schematic structural diagram of a photovoltaic module according to an embodiment of the present disclosure.
Figure 11:
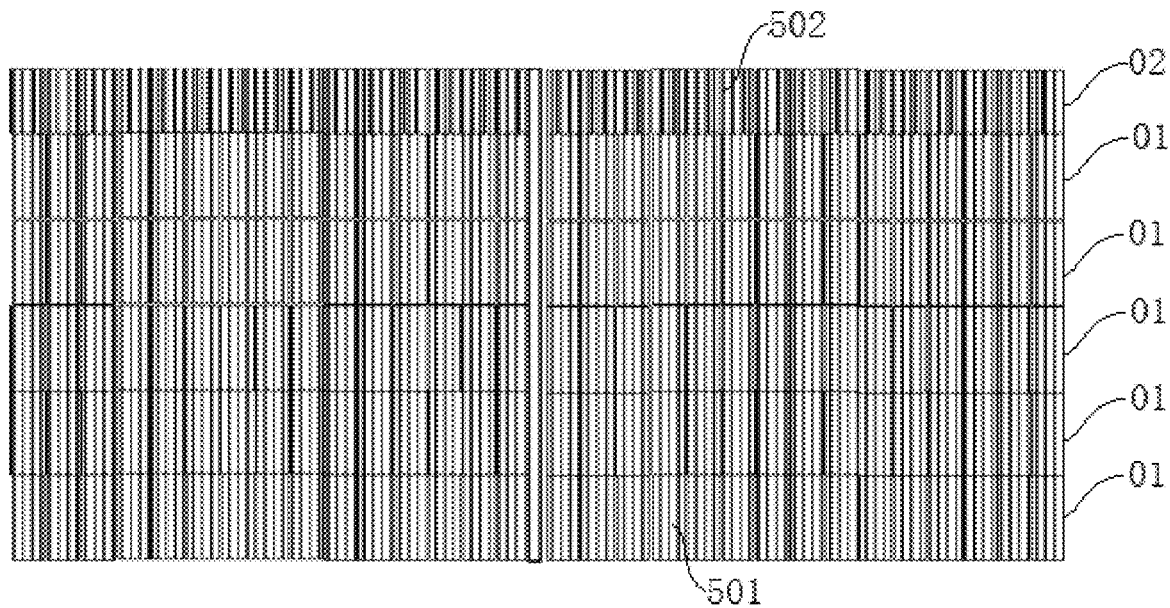
FIG. 11 is a schematic structural diagram of a photovoltaic module according to another embodiment of the present disclosure.

As shown in FIG. 10 or FIG. 11, some embodiments of the present disclosure provide a photovoltaic module, the photovoltaic module includes the solar cell manufactured according to any one of the above methods described in the president disclosure. In the present disclosure, a first direction is defined as perpendicular to a second direction. For example, the first direction may be a length direction of the photovoltaic module, and the second direction may be a width direction of the photovoltaic module.

In an embodiment, the solar cell includes a plurality of square-shaped sub-solar cells 501 arranged along the first direction to form a first solar cell string 01. The photovoltaic module includes a plurality of first solar cell strings 01 arranged along the second direction. The first solar cell strings 01 are electrically connected to each other through a serial connection and/or a parallel connection.

In another embodiment as shown in FIG. 10, the solar cell includes a plurality of strip-shaped sub-solar cells 502 arranged along the first direction to form a second solar cell string 02. The photovoltaic module includes a plurality of second solar cell strings 02 arranged along the second direction. The second solar cell strings 02 are electrically connected to each other through a serial connection and/or a parallel connection. For example, 60 strip-shaped sub-solar cells 502 are arranged along the first direction (the width direction of the strip-shaped sub-solar cell 502) to form a photovoltaic module of 6*60.

In still another embodiment as shown in FIG. 11, the solar cell includes both a plurality of square-shaped sub-solar cells 501 arranged along the first direction to form a first solar cell string 01 and a plurality of strip-shaped sub-solar cells 502 arranged along the first direction to form a second solar cell string 02. The photovoltaic module includes a plurality of first solar cell strings 01 arranged along the second direction and at least one second solar cell string 02 arranged close to the edge of the first solar cell string 01 or interposed between two first solar cell strings 01. That is, the second solar cell string 02 may be arranged close to the upper edge (see FIG. 8) or the lower edge of the first solar cell string 01, and the second solar cell string 02 may also be arranged between two first solar cell strings 01, as long as the first solar cell strings 01 and the second solar cell strings 02 can be combined along the second direction into a predetermined shape. Through filling the gap between the first solar cell strings 01, which is insufficient to place any more first solar cell string 01, by the second solar cell strings 02, the filling rate of the solar cell can be improved without increasing the total dimension of the photovoltaic module, so that the efficient power generation area can be increased to achieve the purpose of improving the power generation efficiency with reduced cost. For example, the square-shaped solar cell 501 has a side length of 182 mm, and the strip-shaped solar cell 502 has a length of 140 mm and a width of 23 mm. The photovoltaic module includes 5 first solar cell strings 01 and 1 second solar cell string 02, the second solar cell string 02 is arranged close to the upper edge of the first solar cell strings 01, so that the dimension of the photovoltaic module along the second direction will be 182*5+140=1050 mm, such dimension is the same as the dimension of 5 columns of square-shaped sub-solar cells 501 arranged in the second direction, but with less large-scale crystal rod consumed and with less device cost, while further improving the utilization rate of the crystal rod.

In some embodiments, the second solar cell string 02 may be arranged between any adjacent first solar cell strings 01, and the number of the second solar cell string 02 cannot be limited herein.

The above description of the disclosed embodiments enables those skilled in the art to implement or use the present disclosure. Various modifications to these embodiments will be obvious to those skilled in the art, and general principles defined herein can be implemented in other embodiments without departing from the spirit or scope of the present disclosure. Therefore, the present disclosure will not be limited to the embodiments shown here but should conform to the widest scope consistent with the principles and novel features disclosed herein.

What is claimed is:

1. A method for manufacturing a monocrystalline silicon wafer, comprising:
providing a monocrystalline silicon rod;
squaring the monocrystalline silicon rod to form a quasi-square silicon rod with a quasi-square cross-section having at least one arc, a length of each of the at least one arc being not less than 15 mm;

slicing the quasi-square silicon rod to form at least one quasi-square silicon wafer each having the at least one arc; and scribing the at least one quasi-square silicon wafer to obtain a square-shaped sub-wafer and at least one strip-shaped sub-wafer, a number of the at least one strip-shaped sub-wafer being equal to a number of the at least one arc of the at least one quasi-square silicon wafer.

2. The method for manufacturing the monocrystalline silicon wafer according to claim 1, wherein the at least one arc comprises four arcs.

3. The method for manufacturing the monocrystalline silicon wafer according to claim 1, wherein squaring the monocrystalline silicon rod to form the quasi-square silicon rod with the quasi-square cross-section comprises:

squaring the monocrystalline silicon rod along four cutting lines to form the quasi-square silicon rod with the quasi-square cross-section.

4. The method for manufacturing the monocrystalline silicon wafer according to claim 3, wherein when viewing a cross-section of the monocrystalline silicon rod, each of the four cutting lines is farther away from a central axis of the monocrystalline silicon rod than a corresponding side of a square inscribed within a circumference the monocrystalline silicon rod.

5. The method for manufacturing the monocrystalline silicon wafer according to claim 3, wherein each of the four cutting lines has a length equal to a sum of a length of one side of a square inscribed within a circumference the monocrystalline silicon rod, a width of a strip-shaped sub-wafer, and a certain distance.

6. The method for manufacturing the monocrystalline silicon wafer according to claim 5, wherein the certain distance is in a range of 1.5 mm to 2.5 mm.

7. The method for manufacturing the monocrystalline silicon wafer according to claim 1, wherein quasi-square silicon wafer is scribed by a laser scribing technique.

8. The method for manufacturing the monocrystalline silicon wafer according to claim 1, wherein a diameter of the monocrystalline silicon rod ranges from 230 mm to 305 mm.

9. The method for manufacturing the monocrystalline silicon wafer according to claim 1, wherein a diameter of the monocrystalline silicon rod is 255.42 mm, a length of an opposite side of the quasi-square silicon rod is 224.75 mm, a quasi-square silicon wafer has a side length of 158.75 mm, a strip-shaped silicon wafer has a length of 125 mm and a width of 32 mm.

10. The method for manufacturing the monocrystalline silicon wafer according to claim 1, wherein a diameter of the monocrystalline silicon rod is 261.77 mm, a length of an opposite side of the quasi-square silicon rod is 232 mm, a quasi-square silicon wafer has a side length of 166 mm, a strip-shaped silicon wafer has a length of 125 mm and a width of 32 mm.

11. The method for manufacturing the monocrystalline silicon wafer according to claim 1, wherein a diameter of the monocrystalline silicon rod is 265.29 mm, a length of an opposite side of the quasi-square silicon rod is 236 mm, a quasi-square silicon wafer has a side length of 170 mm, a strip-shaped silicon wafer has a length of 125 mm and a width of 32 mm.

12. The method for manufacturing the monocrystalline silicon wafer according to claim 1, wherein a diameter of the monocrystalline silicon rod is 301.17 mm, a length of an opposite side of the quasi-square silicon rod is 276 mm, a quasi-square silicon wafer has a side length of 210 mm, a strip-shaped silicon wafer has a length of 125 mm and a width of 32 mm.

13. The method for manufacturing the monocrystalline silicon wafer according to claim 1, wherein a diameter of the monocrystalline silicon rod is 305 mm, a length of an opposite side of the quasi-square silicon rod is 262 mm, a quasi-square silicon wafer has a side length of 210 mm, a strip-shaped silicon wafer has a length of 158.75 mm and a width of 25 mm.

14. The method for manufacturing the monocrystalline silicon wafer according to claim 1, wherein a utilization rate of the monocrystalline silicon rod is in a range of 77.6% to 82.1%.

15. A method for manufacturing at least one solar cell, comprising:

squaring a monocrystalline silicon rod to form a quasi-square silicon rod with a quasi-square cross-section having at least one arc, a length of each of the at least one arc being not less than 15 mm;

slicing the quasi-square silicon rod to form at least one quasi-square silicon wafer having the at least one arc;

forming the at least one solar cell by processing the at least one quasi-square silicon wafer; and scribing the at least one solar cell to obtain a square-shaped sub-solar cell and at least one strip-shaped sub-solar cell, a number of the at least one strip-shaped sub-solar cell being equal to a number of the at least one arc of the at least one quasi-square silicon wafer.

16. The method for manufacturing the at least one solar cell according to claim 15, wherein the square-shaped sub-solar cell has a side length in a range of 158.75 mm to 210 mm.

17. The method for manufacturing the at least one solar cell according to claim 15, wherein the at least one strip-shaped sub-solar cell has a length in a range of 96 mm to 158.75 mm and a width in a range of 20 mm to 25 mm.

18. A method for manufacturing at least one solar cell, comprising:

squaring a monocrystalline silicon rod to form a quasi-square silicon rod with a quasi-square cross-section having at least one arc, a length of each of the at least one arc being not less than 15 mm;

slicing the quasi-square silicon rod to form at least one quasi-square silicon wafer having the at least one arc; and printing, by a printing pattern, the at least one quasi-square silicon wafer into a square-shaped sub-solar cell and at least one strip-shaped sub-solar cell, a number of the at least one strip-shaped sub-solar cell being equal to a number of the at least one quasi-square silicon wafer.

19. The method for manufacturing the at least one solar cell according to claim 18, wherein the printing pattern includes a square printing portion and a strip printing portion surrounding the square printing portion, a front side of the square printing portion includes a front main grid and a front auxiliary grid, a rear side of the square printing portion includes a rear main grid, and the rear main grid corresponds to the front main grid, and a front side of the strip printing portion includes a front first main grid, a front second main grid and a front auxiliary grid, a rear side of the strip printing portion includes a rear first main grid and a rear second main grid, and the rear first main grid and the rear second main grid correspond to the front first main grid and the front second main grid, respectively.

\* \* \* \* \*